(12) United States Patent
Iwata et al.

(10) Patent No.: US 7,648,586 B2
(45) Date of Patent: Jan. 19, 2010

(54) ULTRA-LOW CARBON STAINLESS STEEL

(75) Inventors: Yasushi Iwata, Ibaraki (JP); Akiyoshi Chayahara, Osaka (JP)

(73) Assignee: National Institute of Advanced Industrial & Technology, Tokyo (JP)

(*) Notice: Subject to any disclaimer, the term of this patent is extended or adjusted under 35 U.S.C. 154(b) by 300 days.

(21) Appl. No.: 10/522,811

(22) PCT Filed: Jul. 30, 2003

(86) PCT No.: PCT/JP03/09666

§ 371 (c)(1),
(2), (4) Date: Oct. 28, 2005

(87) PCT Pub. No.: WO2004/022809

PCT Pub. Date: Mar. 18, 2004

(65) Prior Publication Data

US 2006/0104850 A1    May 18, 2006

(30) Foreign Application Priority Data

Jul. 31, 2002    (JP)    ............... 2002-222368

(51) Int. Cl.
*C22C 38/20* (2006.01)
*C22C 38/40* (2006.01)
*C22F 14/16* (2006.01)

(52) U.S. Cl. .................. 148/318; 148/319; 148/325; 148/327; 148/900; 148/239; 148/222

(58) Field of Classification Search ................ 148/319, 148/239, 325, 318, 525, 565, 900, 326, 327, 148/222; 427/528
See application file for complete search history.

(56) References Cited

U.S. PATENT DOCUMENTS 5,052,363 A * 10/1991 Stiles .................... 123/568.29
5,176,760 A * 1/1993 Young ........................ 148/222

FOREIGN PATENT DOCUMENTS

| DE | 19820152 A1 | 11/1999 |
| JP | 59-157273 | 6/1984 |
| JP | 62027902 * | 2/1987 |
| JP | 63-203770 | 8/1988 |

(Continued)

OTHER PUBLICATIONS

English abstract of Japanese patent 53149111, Kawasaki Steel Corp., Dec. 26, 1978.*

(Continued)

*Primary Examiner*—Deborah Yee
(74) *Attorney, Agent, or Firm*—Morgan, Lewis & Bockius LLP

(57) ABSTRACT

In a surface layer of an ultra-low carbon stainless steel comprising a seal function layer in the surface layer, an ion such as a nitrogen ion is implanted to form the seal function layer. Since the ultra-low carbon stainless steel comprising the seal function layer is excellent in elasticity, sealing properties, peelability and abrasion resistance, it can make a seal material which has been used unnecessary, and can realize all stainless-made products such as seal and joint system parts.

7 Claims, 5 Drawing Sheets

FOREIGN PATENT DOCUMENTS

| | | |
|---|---|---|
| JP | 02-250952 | 10/1990 |
| JP | 03-006362 | 1/1991 |
| JP | 04-168273 | 6/1992 |
| JP | 04-180559 | 6/1992 |
| JP | 4-254577 * | 9/1992 |
| JP | 04-325677 | 11/1992 |
| JP | 06-041716 | 2/1994 |

OTHER PUBLICATIONS

Derwent Account #: 1987-075656, the English abstract of Japanese patent 62027902, Feb. 5, 1987.*

Taketeru Umeda et al. "Zairyo technology 9 zairyo no process gijutsu (I)", *Zairyo Technology Zairyo No Process Gijutsu*, XP002973834, Nov. 30, 1987, pp. 231-236.

J.L. Whitton et al., "Chromium Nitride and Martensite Formation in Nitrogen-Implanted Single Crystal Stainless Steel", *Materials Science and Engineering*, XP002332827 CA, vol. 69, 1985, pp. 111-116.

G. Dearnley, "Adhesive, Abrasive and Oxidative Wear in Ion-Implanted Metals", *Materials Science and Engineering*, XP002332828 UK, vol. 69, 1985, pp. 139-147.

C.W. Wegst, "Stahlschlüssel" *Verlag Stahlschlüssel Wegst GMBH*, XP002332829 DE, 2001, p. 523.

* cited by examiner

ULTRA-LOW CARBON STAINLESS STEEL

TECHNICAL FIELD

The present invention relates to a novel ultra-low carbon stainless steel which is excellent in abrasion resistance and scratch resistance and has high adhesiveness with and peelability off metal materials.

BACKGROUND ART

In general, in metal parts such as vacuum joints, vacuum seal valves, liquid or gas pipe joints and seal valves which are made with a high carbon stainless steel as a base material, in order to form the respective constituent members into one body, normally, seal materials such as copper, gold, aluminum, fluorinated resins, rubbers and polyimide are used.

However, in the metal parts which use such seal materials, there are problems in that not only the number of parts increases but also assembly and manufacture steps thereof become complicated. Furthermore, when the metal seal material such as copper is used, since the seal effect depends on the softness of copper per se, the metal fatigue is caused owing to damage and abrasion applied on copper per se, as a result, the seal effect is remarkably deteriorated and the longer lifetime of the metal part itself cannot be obtained, still furthermore, a fluorinated resin seal material is poor in sealing power against helium gas, and the rubber and polyimide seal materials are poor in heat resistance.

In addition, wastes of the seal materials after the use become industrial waste. Accordingly, there are many problems, for example, countermeasures against environmental contamination are required.

Accordingly, development of a stainless material that renders the seal materials unnecessary from stainless metal parts such as vacuum joints, vacuum seal valves, liquid or gas pipe joints and seal valves that are mentioned above, can realize all-stainless seal/joint system products which are excellent in durability, is excellent in resilience and abrasion resistance and tender to environment is in strong demand.

DISCLOSURE OF INVENTION

The present invention has been achieved in view of the above situations of existing technologies and intends to provide a novel ultra-low carbon stainless steel which is excellent in durability and makes the seal materials unnecessary, can realize all-stainless seal/joint system parts, exhibits excellent resilience, peelability and abrasion resistance, and is tender to environment.

The present inventors, after studying intensively to overcome the above problems, found that a stainless steel which has an ion-implanted seal function layer in a superficial inner layer that is obtained by implanting ions on the surface of an ultra-low carbon stainless steel having particular softness and resilience and, in the inside thereof other than the above, maintains a composition prior to the processing (hereinafter referred to also as "hard-surface and soft-inside stainless steel") is effective, and thus the present invention has been completed.

That is, according to the present invention, the following inventions are provided.

(1) An ultra-low carbon stainless steel which comprises a seal function layer in a surface layer.
(2) The ultra-low carbon stainless steel according to the above-described (1), wherein the seal function layer is formed by an ion implantation method.
(3) The ultra-low carbon stainless steel according to the above-described (1) or (2), wherein the ion is a nitrogen ion.
(4) The ultra-low carbon stainless steel according to any one of the above-described (1) to (3), wherein the ultra-low carbon stainless steel contains carbon in an amount of 0.01% by weight or less.
(5) The ultra-low carbon stainless steel according to any one of the above-described (1) to (4), wherein the ultra-low carbon stainless steel is dehydrogenated in advance.

BEST MODE FOR CARRYING OUT THE INVENTION

Figure 1:
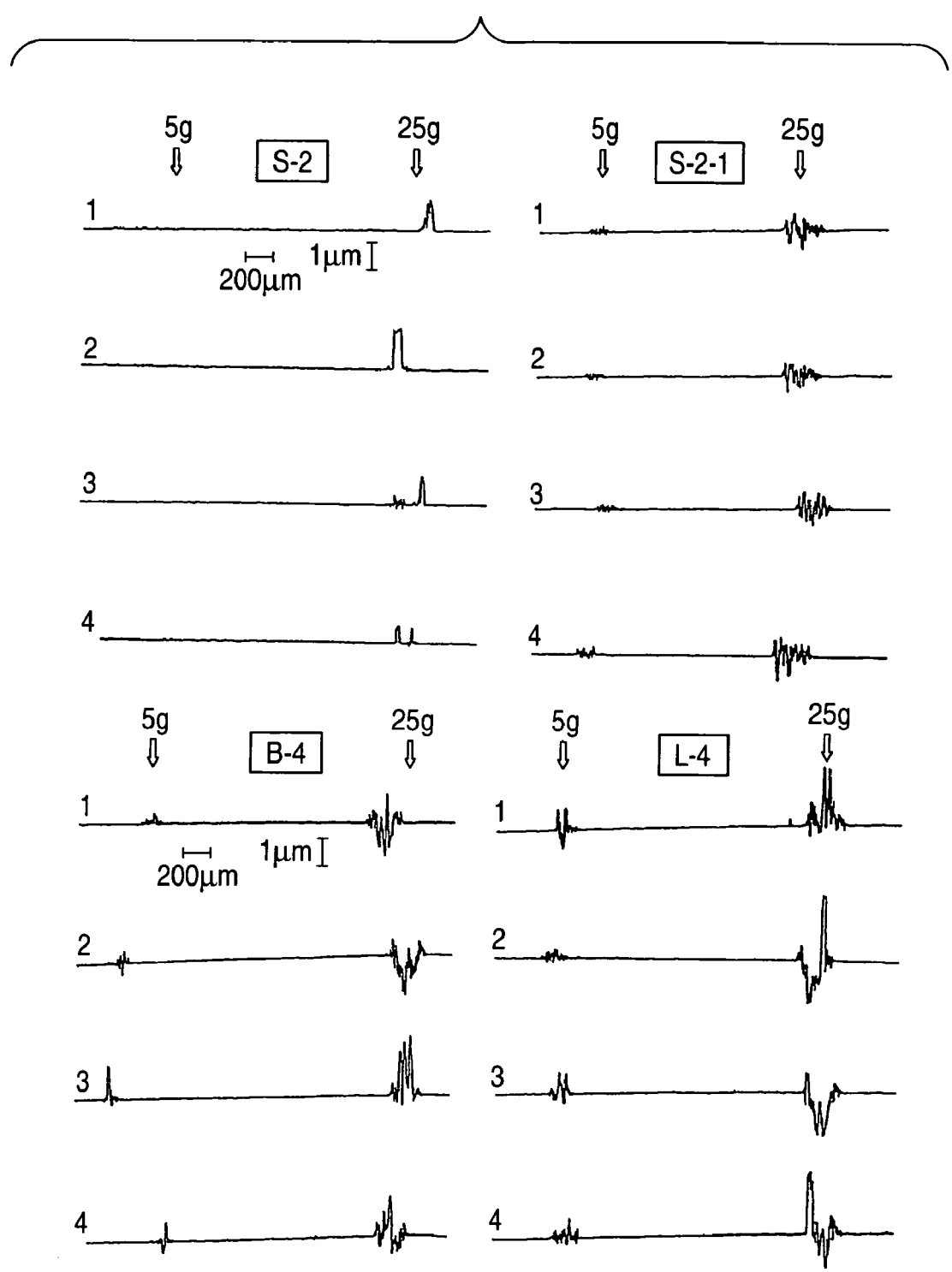
FIG. 1 shows graphs of measurements of the abrasion resistance in air of stainless steels of Examples 1 and 2 and Comparative Examples 1 and 2 measured according to a ball-on rotation method.

The ultra-low carbon stainless steel according to the present invention comprises a seal function layer in a surface layer thereof.

The ultra-low carbon stainless steel which comprises a seal function layer is a stainless steel containing carbon in an amount of 0.01% by weight or less and preferably defined as one having an austenite structure.

In the ultra-low carbon stainless steel which comprises a seal function layer, non-metal inclusions and gaseous components in the steel are largely reduced. As components constituting the steel, metals and non-metals such as Ni, Co, Mo, Si, Mn, P, S, Cu and Al are exemplified other than Fe and carbon, and a constitution ratio thereof can be arbitrarily selected within a range which allows the austenite structure.

As the typical ultra-low carbon stainless steel which is used in the present invention, as commercially available ones, for instance, Clean Star A and Clean Star B manufactured by Daido Steel Co., Ltd and the like are exemplified.

Compositions of Clean Star A and Clean Star B are as follows.

TABLE 1

Typical Example of Chemical Components (mass %) of Clean Star

| Material Name | C | Si | Mn | P | S | Cu | Ni | Cr | Mo | Al | N* | O* | H* |
|---|---|---|---|---|---|---|---|---|---|---|---|---|---|
| Clean Star A | 0.006 | 0.13 | 0.04 | 0.020 | 0.001 | 0.17 | 14.64 | 16.95 | 2.25 | <0.002 | 65 | 5 | 1.6 |
| Clean Star B | 0.007 | 0.23 | 0.23 | 0.025 | 0.001 | 0.19 | 14.66 | 16.91 | 2.23 | 0.002 | 80 | 7 | 2.0 |

The ultra-low carbon stainless steel which is used as a raw material in the present invention can be manufactured according to an EAVAC method in which ultra-low carbon/nitrogen stainless steel is melted by a VCR method or a remelting method such as vacuum arc remelting (VAR).

The hard-surface and soft-inside stainless steel according to the present invention can be obtained by implanting ions in a surface layer (surface internal layer) of the ultra-low carbon stainless steel.

As the ion implantation method, so far known methods such as plasma ion implantation or ion beaming can be adopted. Furthermore, as the ions, elements such as N, C, B, Ti and Ta or compounds containing these elements can be used, and a nitrogen ion can be preferably used.

The seal function layer in the present invention is a layer which has resilience owned by the ultra-low carbon stainless steel per se, is excellent in adhesiveness with other metals, preferably a stainless steel material owing to the deformation within the elastic range, has high surface hardness, and is excellent in abrasion resistance and scratch resistance.

Accordingly, a thickness of the seal function layer is set so that the conflicting respective characteristics such as the resilience, the adhesiveness and the surface hardness are well balanced and exhibited.

In this case, since the hardness of the ion-implanted ultra-low carbon stainless steel decreases gradually as goes deeper from the surface in a depth direction, a thickness of the seal function layer is preferably set within a range which exhibits a value higher than that of the ultra-low carbon stainless steel before the ion-implantation, preferably within a range which exhibits the hardness at least about two times that of the ultra-low carbon stainless steel before the ion-implantation.

The thickness of the seal function layer, although different depending on the kind of the ultra-low carbon stainless steel which is a raw material, kind of an ion which is implanted, and an amount which is implanted, is normally within a range of 200 nm from the surface layer, and preferably within a range of 100 nm from the surface layer.

Regarding an ion implantation amount, an implanted dose and implanted energy are appropriately set so as to obtain the above desired thickness; however, normally, the implanted dose is $1 \times 10^{18}$ N/cm$^2$, and the implanted energy is 20 to 400 keV.

When an ion is implanted, in order that the seal function layer can sufficiently exhibit the characteristics thereof, the surface of the ultra-low carbon stainless steel which is a raw material is preferably polished so as to be as smooth as possible. In this case, the accuracy of the polished surface is set at a level which is similar to, preferably less than, an ion implantation range.

Furthermore, normally, an element which is ion-implanted into the surface layer reacts with elements within the stainless steel such as Fe to form a metal nitride phase or a metal carbide phase such as Fe$_x$N and Fe$_x$C to thereby form the seal function layer.

The hard-surface stainless steel comprising the seal function layer has the flexibility just intermediate of ordinary austenite stainless steel (containing carbon in an amount of 0.03% or more) and copper and exhibits the hardness about 5.6 times that of the ultra-low carbon stainless steel of which surface layer does not have the seal function layer (later described example). Since the hard-surface and soft-inside stainless steel is flexible and excellent in elasticity, it is excellent in adhesiveness. Additionally, since it is very high in abrasion resistance owing to the superhardness of the surface layer portion, it has excellent scratch resistance.

In this case, as described in a later example, on the surface of the stainless steel which is heated at 450° C. in vacuo after the N$_2^+$ ion implantation, a reaction in which N and H react to form NH$_3$ becomes conspicuous, a reactive desorption of N is caused, and as a result, the hardness decreases in some cases. Accordingly, when a working circumstance temperature of seal-less stainless according to the present invention exceeds 400° C., it is preferred that before the N$_2^+$ ion implantation, the ultra-low carbon stainless steel which is a raw material is heated in advance, for example, at 450° C. in vacuo for dehydrogenation, and thereafter the N$_2^+$ ion implantation is carried out.

The hard-surface and soft-inside stainless steel according to the present invention is, as mentioned above, rich in elasticity, excellent in adhesiveness between metals each other, strongly resistant against scratch and so on, and furthermore, excellent in peelability of a seal surface. That is, when ultra-low carbon stainless steels which do not have the seal function layer different from the present invention are directly brought into contact with each other, since metals weld each other on the seal surfaces, it is very difficult to impart the peelability. However, in the case of the hard-surface and soft-inside stainless steel according to the present invention, since the surface layer of the stainless steel is subjected to special surface modification, metals weld each other due to direct contact with very difficulty, and additionally, the flexibility and the elasticity of the material per se are not damaged. As a result, a seal surface having the seal functionality and the peelability in combination can be realized.

Thus, for the first time, all stainless joints and sealing valves which do not necessitate a seal member can be produced. In this connection, generally, methods in which the ion implantation is applied on the surface of a high hardness low carbon stainless steel to form a hardened layer are well known. However, the ion implantation methods intend only to improve only the strength, durability and abrasion resistance of the high hard stainless steel per se and are different from the present invention which intends to modify the surface of a flexible and elastic ultra-low carbon stainless steel, and, while holding the soft elasticity owned by the ultra-low carbon stainless steel per se and maintaining the adhesiveness with other metal materials, preferably a stainless steel material, to heighten the surface hardness thereof and to improve the physical properties such as the abrasion resistance and the scratch resistance.

Accordingly, the ultra-low carbon stainless steel comprising a seal function layer in a surface layer according to the present invention can be clearly distinguished in its function and effects from the conventional high hardness stainless steel having an ion implantation layer.

Since the hard-surface and soft-inside stainless steel according to the present invention has the above-described configuration, it is superior in abrasion resistance and scratch resistance to a normal austenite steel and is a structural material which is excellent in sealing property, adhesiveness and peelability.

surface finishing of the respective samples is shown in Table 2. The surface accuracy of the samples was 7 to 24 nm in the average roughness and 47 to 141 nm in the peak of the roughest irregularity for the samples for use in ion implantation and 5 to 9 nm in the average roughness and 30 to 90 nm in the peak of the roughest irregularity for the comparative samples.

TABLE 2

| Sample | Average thickness (mm) | Evaluation length (mm) | Section curve | | | Roughness curve | | |
|---|---|---|---|---|---|---|---|---|
| | | | Ra (µm) | Rz (µm) | Ry (µm) | Ra (µm) | Rz (µm) | Ry (µm) |
| No-1 | 2.016 ±0.002 | 0.025 | 0.0072 | 0.054 | 0.072 | 0.007 | 0.053 | 0.069 |
| No-2 | 2.006 ±0.002 | 0.08 | 0.0242 | — | 0.141 | 0.0238 | — | 0.139 |
| No-3 | 2.015 ±0.002 | 0.08 | 0.0079 | — | 0.047 | 0.006 | — | 0.037 |
| No-4 | 2.006 ±0.002 | 0.08 | 0.0174 | 0.08 | 0.102 | 0.0168 | 0.079 | 0.097 |
| B-1 | 1.996 ±0.002 | 0.08 | 0.005 | 0.03 | 0.03 | 0.004 | 0.03 | 0.03 |
| B-2 | 1.995 ±0.002 | 0.08 | 0.006 | 0.03 | 0.04 | 0.006 | 0.03 | 0.04 |
| B-3 | 2.000 ±0.001 | 0.08 | 0.006 | 0.03 | 0.04 | 0.006 | 0.03 | 0.04 |
| B-4 | 1.998 ±0.002 | 0.08 | 0.009 | 0.04 | 0.06 | 0.009 | 0.04 | 0.06 |
| L-1 | 1.997 ±0.002 | 0.08 | 0.003 | 0.02 | 0.03 | 0.003 | 0.02 | 0.03 |
| L-2 | 1.999 ±0.002 | 0.08 | 0.015 | 0.05 | 0.08 | 0.015 | — | 0.08 |
| L-3 | 1.988 ±0.002 | 0.08 | 0.015 | 0.05 | 0.09 | 0.012 | 0.05 | 0.07 |
| L-4 | 1.992 ±0.002 | 0.08 | 0.005 | 0.03 | 0.04 | 0.004 | 0.03 | 0.03 |

Accordingly, the hard-surface and soft-inside stainless steel according to the present invention can be said a stainless steel material which makes a sealing material unnecessary from high carbon stainless steel metal parts such as vacuum joints, vacuum sealing valves, pipe joints for liquid and gas and sealing valves, can realize all stainless steel-made seal and joint system products which are excellent in durability, and is excellent in elasticity and abrasion resistance. Furthermore, since the used metal parts have no seal material, the conventional environmental contamination owing to the seal waste materials can be avoided and a recovering device or equipment of the seal waste materials can be eliminated.

Furthermore, since the hard-surface and soft-inside stainless steel according to the present invention is a material which is excellent also in heat resistance, can be used under a high temperature circumstance where a pipe joint or a seal valve which uses, as a seal member, a stable polymer material such as rubber, Teflon or polyimide is hardly utilized. Still furthermore, as the seal member, there are many advantages in that fine particulate contamination which is found when a precious metal such as copper is used is not caused, a structure of a product can be made simpler, the number of parts can be reduced, and thus, the productivity can be remarkably improved.

Best Mode for Carrying out the Invention

EXAMPLES

The present invention is described below in more detail based on Examples.

Reference Example

Preparation of Sample:

Four sheets of Clean Star B which were processed into a diameter of 40 mm and a thickness of 2.0 mm and used for ion implantation (referred to as No-1 to No-4), and, as comparative samples, four sheets each of Clean Star B (referred to as B-1 to B-4) and austenite stainless SUS316L (L-1 to L-4) were prepared and subjected to mechanical polishing. The Example 1

Preparation of Ultra-low Carbon Stainless Steel Having Seal Function Layer:

Ion Implantation:

Four sheets of the samples (No-1 to No-4) were circularly arranged with a center pitch of 60 mm on a disc jig (SUS316L) having a diameter of 140 mm and set in vacuo bath, followed by applying argon sputter cleaning, further followed by ion implantation.

At the argon sputter cleaning, an Ar gas was introduced at a pressure of 0.33 Pa and a high frequency device was introduced in the Ar gas to apply cleaning on a sample surface. The frequency of the introduced high frequency was 13.56 MHz, the output was 150 W, and the cleaning time was 30 minutes.

Next, after the inside of the vacuum bath was once returned to a vacuum, $N_2$ gas was introduced at a pressure of 0.39 Pa, a high frequency pulse (pulse width: 50 µs, frequency: 13.56 MHz, output power: 25 W and repetition frequency: 1,000 Hz) was similarly applied to a disc jig to the sample, and thereby plasma is generated along the surface of the sample. In the plasma owing to low power discharge, almost all are $N_2^+$ molecule ions. High voltage pulses (pulse width: 10 µs, and repetition frequency: 1,000 Hz) at 25 kV are applied to the sample to allow the $N_2^+$ molecule ions in plasma to impinge on the surface of the sample. In the ion implantation method, the plasma is uniformly formed in conformity with a shape of the sample and, owing to applied high voltage pulses, the $N_2^+$ ions are simultaneously implanted by the four sheets of the samples, so that the same amount of the $N_2^+$ ions are uniformly implanted on the four sheets of the samples.

Amount of Implantation:

A range when a $N_2^+$ molecule ion is accelerated and implanted at 25 kV onto stainless steel is almost the same as that when a $N^+$ atom ion is implanted at 12.5 keV. When a simulation is carried out by using TRIM code (version 1998) with a target set to Fe having the density of 7.866 g/cm$^3$, the range becomes 16.2 nm.

An estimation of an amount of implanted nitrogen ions was calculated on the basis of an amount of implantation obtained from Auger electron spectrometry by implanting nitrogen on a silicon substrate. As a result, an amount of nitrogen implanted to the stainless steel was $1.65 \times 10^{17}/cm^2$. The number of metal atoms present in the range of 16.2 nm in the stainless steel, when calculated all composition of the stainless steel as Fe, is about $8.47 \times 10^{22}$ atom/$cm^3 \times 16.2$ nm $= 1.37 \times 10^{17}$ atom/$cm^2$. Accordingly, in the present experiment, per iron atoms present in a volume in the surface layer of 16.2 nm of the stainless steel, nitrogen ions about 1.2 times the iron atoms were implanted.

Thus, ultra-low carbon stainless steels on which N ions were implanted to a depth of 16.2 nm from the surface and thereby a hard seal function layer was formed (hereinafter, ultra-low carbon stainless steels corresponding to Samples No-1 to No-4 and having a seal function layer are referred to as Samples S-1 to S-4, respectively) were prepared.

Vickers Hardness:

The hardness of the above-obtained Sample S-2 was measured by a Vickers hardness test method. A result thereof is shown in Table 3.

Abrasion Resistance Test:

The abrasion resistance test of the above-obtained sample S-2 was carried out according to a ball-on rotation test method.

Ball-on Rotation Test:

A test ball was brought into contact with a sample, the sample was rotated at a constant speed, depths of friction marks marked on the sample surface were measured, and thereby the surface hardness showing the abrasion resistance of the sample was measured. The speed of the rotation was set at 50 mm/s on a contact point with the test ball, and, as the test ball, a bearing ball SUS440C having a diameter of 4.0 mm was used. The test was carried out in air and in two-stroke engine oil (jinen) and periods of rotation, respectively, were set at 10 and 30 minutes in total.

(1) Test Method in Air

In air, each of 5 g and 25 g was added to the test ball, and depths were measured at positions divided into 4 along a circumference of a formed surface friction mark. Results are shown in FIG. 1.

(2) Test Method in Oil

Figure 2:
FIG. 2 shows graphs of measurements of the abrasion resistance in oil of stainless steels of Examples 1 and 2 and Comparative examples 1 and 2 measured according to a ball-on rotation method.
Figure 2:
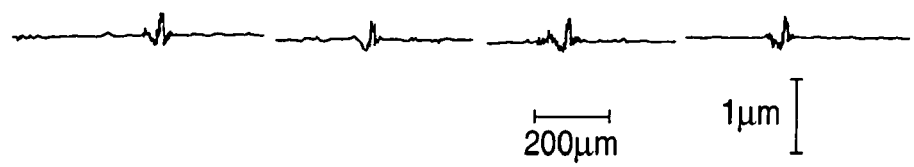
Figure 2:
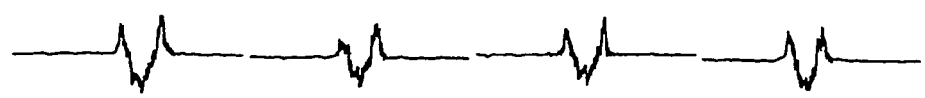
Figure 2:
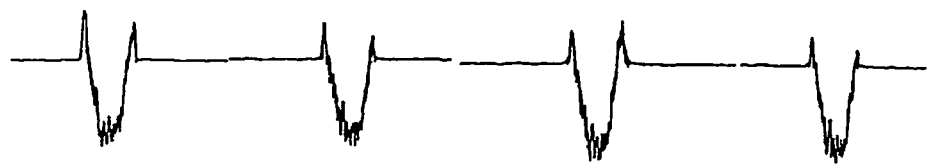
Figure 2:
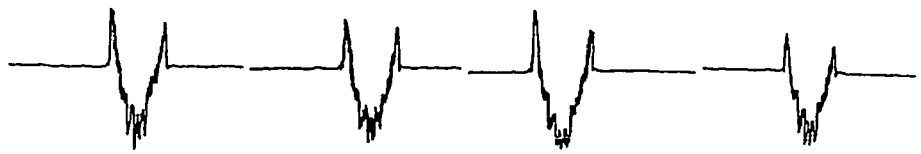

An additional weight to the test ball was 100 g. Results are shown in FIG. 2.

In the case of the friction test in the oil, the surface of the formed friction mark becomes smoother and the adhesive abrasion is measured at a lower noise side.

Figure 3:
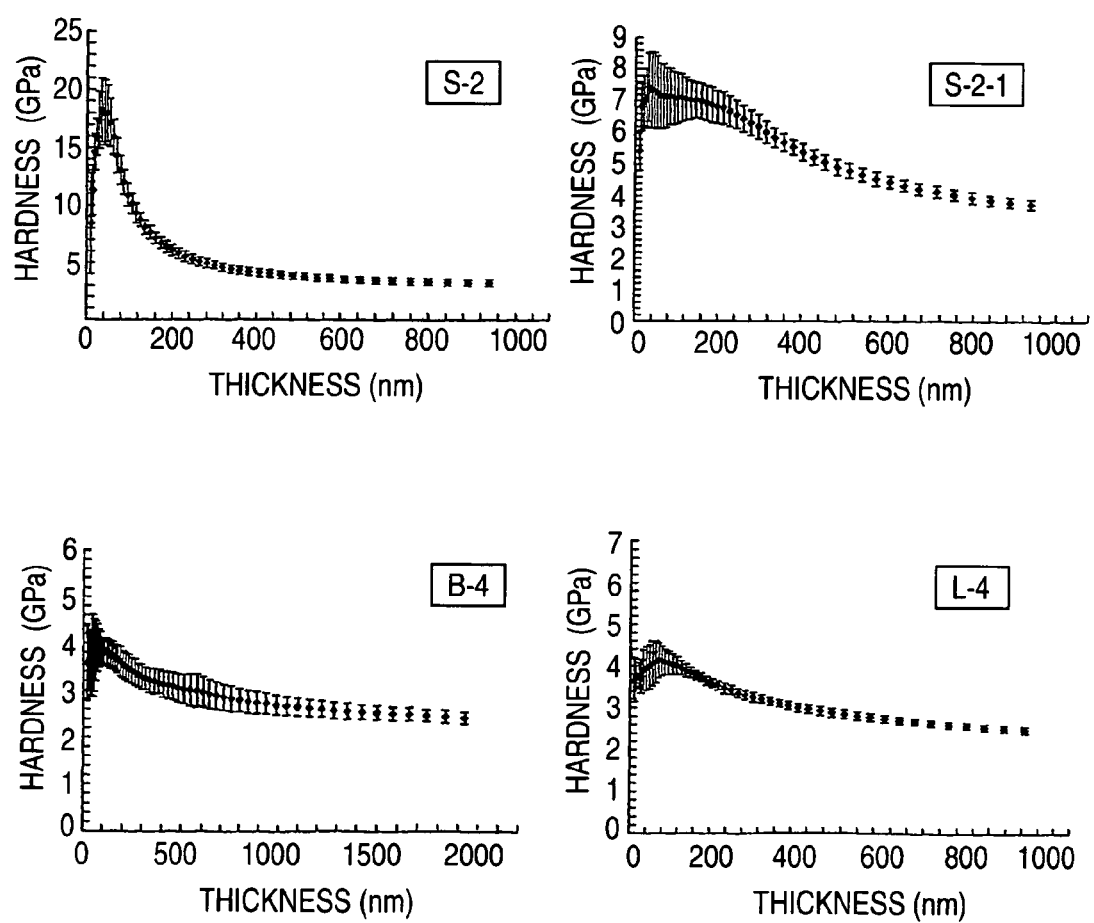
FIG. 3 shows graphs of measurements of the hardness in a thickness direction of stainless steels of Examples 1 and 2 and Comparative examples 1 and 2.

Measurement of the Surface Hardness:

By taking into consideration that the range of nitrogen ions implanted into Clean Star steel is about 20 nm from a sample surface, in order to investigate a distribution of the hardness in a depth direction with a nano-scale precision, a nano-indentation test was carried out. That is, the surface hardness of the above-obtained sample S-2 was measured according to the nano-indentation method. Results are shown in FIG. 3.

The measurement method is shown below.

Nano-indentation Measurement Method:

For a probe chip (indenter), a Berkovich (triangular pyramid) diamond indenter B1281 having a tip end diameter of about 100 nm was used. In measuring the hardness, with a weight applying on the indenter, the indenter was thrust from a sample surface into the sample at a constant speed. The hardness is expressed with a pressure value obtained by dividing a weight applied when the indenter was thrust therein by a projection area of the indenter. The projection area of the indenter is expressed, with a distance "h" from a tip end of the indenter, by an indenter section area A=F(h), and the relationship thereof is previously known from a shape of the indenter. Accordingly, by measuring displacements (depth) when the indenter is thrust into the sample from a sample surface, a distribution of the hardness relative to the depth can be measured. A small vibration was applied to a probe chip by making use of an electromagnetic coil to measure the hardness. A vibration frequency was 45.0 Hz, and amplitude of vibration was 2.0 nm. In the nano-indentation measurement, by making a drift of measurement distance due to a temperature variation as small as possible, an accurate measurement of the hardness distribution can be realized. The measurement was carried out after the drift amount became 0.050 nm/s or less.

Example 2

Sample S-2 was attached to a device at room temperature, followed by preliminary exhaust for 30 minutes and exhaust for 2 hours, further followed by raising a temperature at 0.1° C./s. After the temperature reached 450° C., it was maintained constant for 36 hours, followed by naturally cooling and annealing, to thereby obtain an ultra-low carbon stainless steel comprising a seal function layer (hereinafter, referred to as Sample S-2-1).

Of Sample S-2-1, the hardness, the abrasion resistance in air, the abrasion resistance in oil and the surface hardness were measured according to similar methods as example 1. Results thereof are shown in Table 3, FIGS. 1 to 3, respectively.

Comparative Example 1

Except that Sample S-2 according to Example 1 was replaced with Sample B-4 of Table 1 (ultra-low carbon stainless steel before the ion implantation, that is, Clean Star B (containing 0.008% by weight of carbon)), the hardness, the abrasion resistance in air, the abrasion resistance in oil and the surface hardness were measured in the same manner as in Example 1. Results thereof are shown in Table 3, FIGS. 1 to 3, respectively.

Comparative Example 2

Except that Sample S-2 according to Example 1 was replaced with Sample L-4 of Table 1 (SUS316L (containing 0.03% by weight of carbon)), the hardness, the abrasion resistance in air, the abrasion resistance in oil and the surface hardness were measured in the same manner as in Example 1. Results thereof are shown in Table 3, FIGS. 1 to 3, respectively.

TABLE 3

| Sample | S2 | S-2-1 | B-4 | L4 |
|---|---|---|---|---|
| Hv(Kgf/$mm^2$) | 188.3 | 182.3 | 163.8 | 178.5 |

Also, in order to confirm a state of existence of nitrogen in each of the above Samples S-1 to S-4, a temperature programmed desorption test and a quantitative analysis test were carried out. In the experiment, Sample S-1 was used as a representative sample.

In general, molecules and atoms adsorbed on a solid surface, in turn from weaker ones in the adsorptive power, are desorbed. When the desorbed ones are measured by use of a mass-spectrometer, information on the adsorption state can be obtained. Here, in order to investigate a bonding state in the Clean Star after the ion implantation, the temperature programmed desorption test was carried out.

Figure 4:
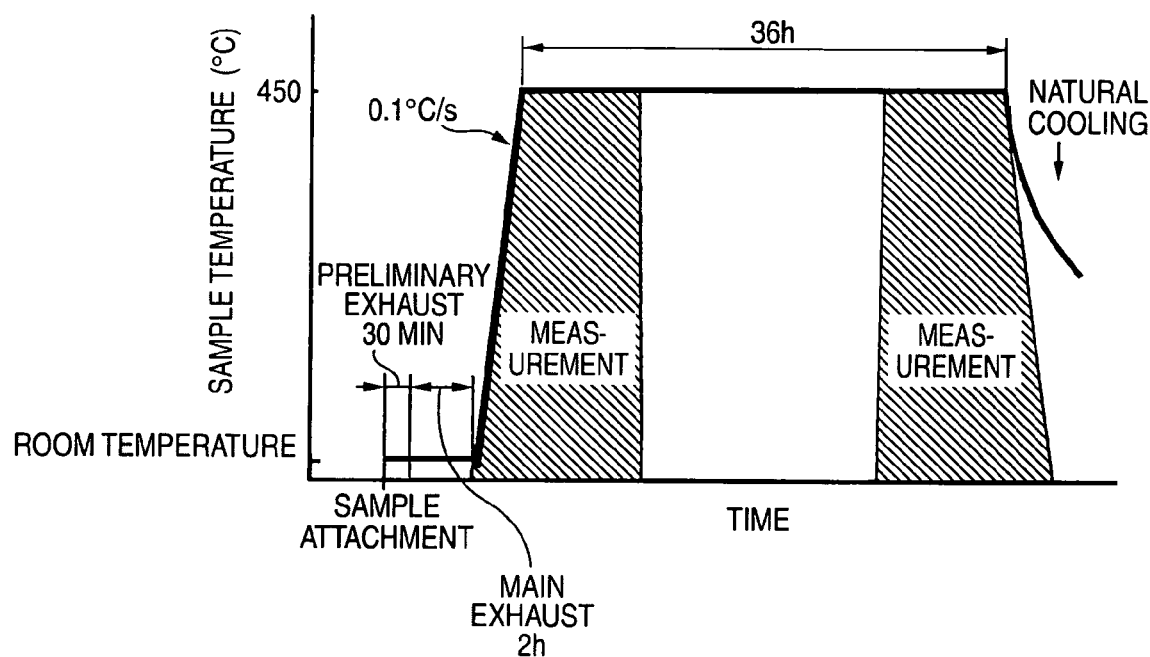
FIG. 4 is an explanatory diagram of a procedure of temperature programmed desorption measurement of an ultra-low carbon stainless steel (S-1) according to the present invention.

First, Sample S-1 was attached to a device at room temperature, followed by preliminary exhaust for 30 minutes and exhaust for 2 hours, further followed by raising a temperature at 0.1° C./s. After the temperature reached 450° C., it was maintained constant for 36 hours, followed by naturally cooling, to thereby obtain Sample S-1-1. At that time, a desorption gas was measured by using a mass spectrometer. A chart showing the measurement procedure is shown in FIG. 4.

Figure 5:
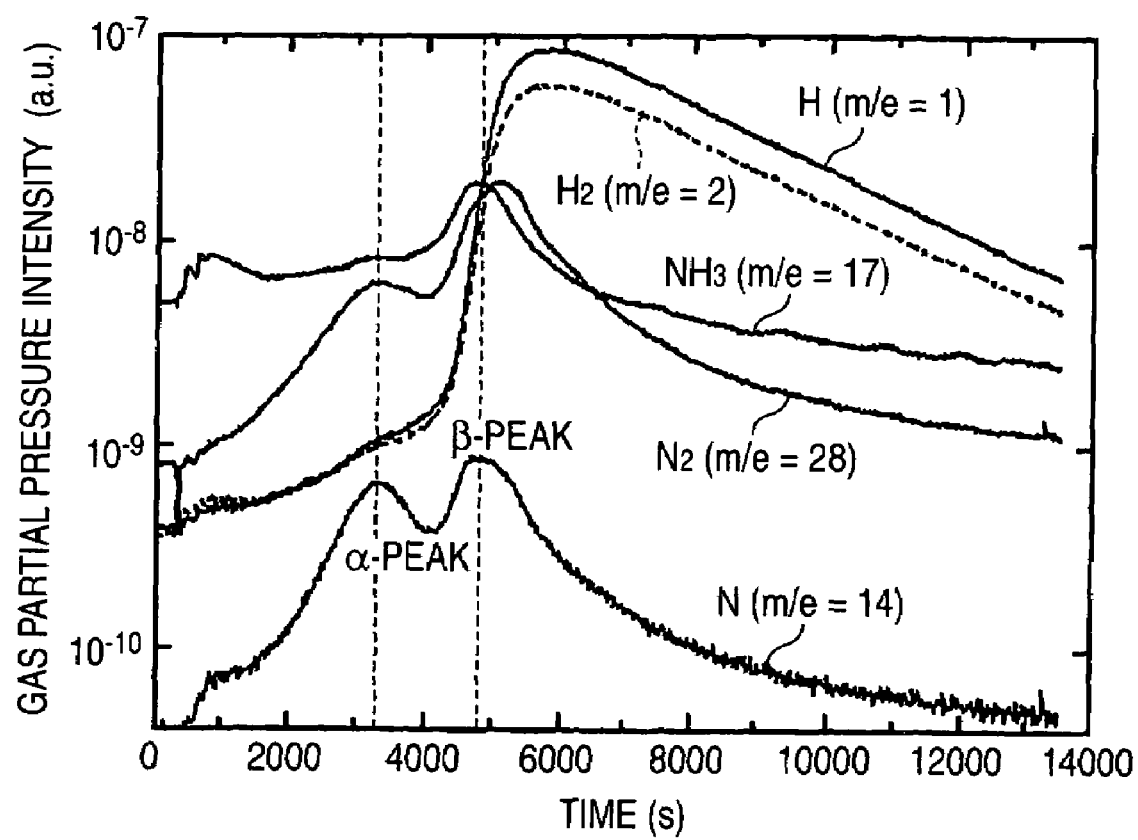
FIG. 5 is a graph showing analysis results of various kind gases generated when the ultra-low carbon stainless steel (S-1) is subjected to thermal desorption spectrometry.

In FIG. 5, with a time measured from the beginning of temperature rise at 0.1° C./s in the horizontal axis, relative desorption intensities of H, $H_2$, N, $NH_3$ and $N_2$ are shown in the vertical axis. Each of the molecules $NH_3$, $N_2$ and N showed desorption peaks at about 350 and 450° C. The respective desorption peaks are named, form a lower temperature side, α-peak and β-peak. Furthermore, at 450° C., hydrogen desorption was simultaneously observed.

Composition quantitative analyses of non-heated Sample S-1 and Sample S-1-1 after the temperature programmed desorption test were carried out to know that there were differences in amounts of carbon and nitrogen before and after the heating.

(1) Analysis of C

From each of samples, 1 g was weighed and the quantitative analysis of C was carried out by a high frequency furnace combustion-infra red absorption method.
Device: Carbon Analyzer CS-444 manufactured by LECO
Combustion temperature: 1,700° C.
Combustion improver: W+Sn
Reference: JIS Z2615 "General rules for determination of carbon in metallic materials"

(2) N Analysis

From each of samples, 0.5 g was weighed and the quantitative analysis of N was carried out by an inactive gas fusion-thermal conductivity method.
Device: Nitrogen Analyzer TC-436 manufactured by LECO
Combustion temperature: 2,200° C.
Reference: JIS G1228 "Iron and steel—Methods for determination of nitrogen content"
Results of analysis are as follows.
Carbon content of S-1: 0.008% by weight
Carbon content of S-1-1: 0.008% by weight
Nitrogen content of S-1: 0.0096% by weight
Carbon content of S-1-1: 0.0096% by weight
Each of above values is an average value of measurements obtained by measuring twice.

From the above, it is found that there is no difference, before and after temperature programmed desorption, between contents of carbon and between contents of nitrogen.

Consideration:

Next, experimental results of Examples 1 and 2 and Comparative Examples 1 and 2 are considered.

Hardness:

Values of the Vickers hardness of Samples S-2, S-2-1, B-4 and L-4 are as shown in Table 3. That is, although the Vickers hardness of Sample B-4 (Clean Star B before the ion implantation) is 163.8 kgf/mm², the Vickers hardness of Sample S-2 which is obtained by applying ion implantation to Sample B-4 is 188.3 kgf/mm², that is, an improvement of about 1.150 times. Furthermore, the Vickers hardness of sample S-2 is found to be 1.076 times a value of Sample L-4 (SUS316L) which is considered very high in this field.

Abrasion Resistance:

From FIGS. 1 and 2, in all of the abrasion tests in air and in oil, Clean Star Samples S-2 to which nitrogen ion was implanted according to the present invention are apparently suppressed to be low in the adhesive abrasion in comparison with Clean Star Sample B-4 to which the ion implantation was not applied, that is, excellent in abrasion resistance. In particular, in Sample S-2 to which only surface treatment due to nitrogen ion implantation was applied and the heating was not applied, the abrasion resistance was so high that the adhesive abrasion at an additional weight of 5 g was not confirmed.

Furthermore, a volume ground from a sample surface owing to the adhesive friction in oil was calculated for each of the respective samples and compared to that of Sample L-4 as a standard. Results are shown in Table 4.

TABLE 4

| Sample No. | Abrasion loss volume ratio |
|---|---|
| S-2 | 0.04 |
| S-2-1 | 0.23 |
| B-4 | 1.43 |
| L-4 | 1 |

From Table 4, it is found that the abrasion of Clean Star (B-4) to which the ion implantation was not applied was at least 40% worse than that of L-2 (SUS316L steel) owing to the adhesive friction. On the other hand, it was found that the surface of Sample S-2 which was obtained by implanting nitrogen ions to the Clean Star according to the present invention was worn at only 4% of the abrasion amount of the surface of sample L-4, that is, is very strong to the friction.

Surface Hardness:

From the above consideration, it was found that Clean Star steel B-4 that is softer in both the Vickers hardness and the abrasion resistance than the SUS316L steel (L-4), when subjected to nitrogen ion implantation, inversely becomes a material (S-2) harder than the SUS316L steel.

Furthermore, from FIG. 3 showing results of nano-indentation test, the followings can be concluded.

In comparison with the surface hardness, 3.2 GPa, of untreated Clean Star (B-4), the surface hardness of Sample (S-2) which was subjected to $N_2^+$ ion implantation reached 18 GPa, that is, 5.6 times that of Sample B-4 and 4.2 times that of SUS316L material (L-4). Furthermore, as the depth from the surface becomes deeper, the hardness becomes smaller, and at a depth of 110 nm from the surface the hardness becomes one half (9 Pa) and at about 1 μm it becomes the same as that of the untreated sample. Accordingly, a thickness to which the hardening to two times (6.56 GPa) or more that of the untreated sample can be expected by the $N_2^+$ ion implantation is a surface portion of 200 nm or less from the surface.

In Clean Star material (S-2-1) which was heated at 450° C. in vacuo after the $N_2^+$ ion implantation, owing to the $N_2^+$ ion implantation, implanted ions partially diffuse to a deep portion of about 600 nm from the surface; however, the surface hardness decreases to 7.6 GPa at most. It is assumed that as H in the stainless steel is desorbed, on the surface of the stainless steel, N and H react according to $N+3H \rightarrow NH_3$ to cause the reactive desorption of H, resulting in decrease in the hardness. Accordingly, when an application environment of the ultra-low carbon hard-surface and soft-inside stainless steel exceeds 400° C., it is found desirable that before the $N_2^+$ ion implantation, the ultra-low carbon stainless steel is previously heated at 450° C. in vacuo to apply dehydrogenation, followed by the $N_2^+$ ion implantation.

Overall Consideration:

Low carbon austenite stainless steel having a carbon content of 0.008% normally exhibits a Vickers hardness ratio of 0.9377, just intermediate of the ordinary austenite stainless steel SUS316L and copper. When the $N_2^+$ ion implantation at 25 kV is applied to the ultra-low carbon austenite stainless steel, in a superficial region of 110 nm of the stainless steel, the N atom forms a $Fe_4N$ or $Fe_2N$ phase. The region has the hardness which reaches 5.6 times that of the inside thereof and 4.2 times that of the SUS316L, and has the abrasion resistance against the adhesive friction which reaches a value of 25 times that of the SUS316L. Accordingly, when the $N_2^+$ ion implantation at 25 kV is applied to the austenite stainless steel which contains 0.008% of carbon, the stainless steel which is soft and elastic in the inside thereof, excellent in adhesiveness, strongly scratch-resistant and excellent in abrasion resistance to the adhesive friction between metals each other, that is, one suitably called the "hard-surface and soft-inside stainless steel", can be obtained. The hard-surface and soft-inside stainless steel can be said to be a novel stainless steel material which makes a sealing material unnecessary from high carbon stainless steel metal products such as vacuum joints, vacuum sealing valves, pipe joints for liquid and gas and sealing valves, can realize all stainless-made steel seal and joint system products which are excellent in durability, and is excellent in elasticity and the abrasion resistance.

INDUSTRIAL APPLICABILITY

Since the ultra-low carbon stainless steel comprising a seal function layer according to the present invention, as mentioned above, has excellent properties in abrasion resistance and scratch resistance compared to ordinary austenite stainless steel and, in spite of a structural material, shows excellent seal properties and adhesiveness, it can be said to be a stainless steel material which makes a sealing material unnecessary from high carbon stainless steel metal products such as vacuum joints, vacuum sealing valves, pipe joints for liquid and gas and sealing valves, can realize all stainless steel-made seal and joint system products which are excellent in durability, and is excellent in elasticity and the abrasion resistance.

Furthermore, since the used metal parts have no seal material, the conventional environmental contamination owing to the seal waste materials can be avoided and a recovering device or equipment of the seal waste materials can be eliminated.

Still furthermore, since the stainless steel comprising a seal function layer according to the present invention is a material which is excellent also in heat resistance, can be used under a high temperature circumstance where a pipe joint or a seal valve which uses, as a seal member, a stable polymer material such as rubber, Teflon or polyimide is hardly utilized. Furthermore, as the seal member, there are many advantages in that fine particulate contamination which is found when a precious metal such as copper is used is not caused, a structure of a product can be made simpler, and the number of parts can be reduced, and thus the productivity can be remarkably improved.

The invention claimed is:

1. An ultra-low carbon stainless steel which comprises a seal function layer in a surface layer,
wherein the seal function layer is formed by an ion implantation method, and
the ultra-low carbon stainless steel contains carbon in an amount limited to 0.006% to 0.008% by weight.

2. The ultra-low carbon stainless steel according to claim 1, wherein the ion is a nitrogen ion.

3. The ultra-low carbon stainless steel according to claim 1, wherein the ultra-low carbon stainless steel is dehydrogenated in advance.

4. A member with a seal function, the member comprising an ultra-low carbon stainless steel containing carbon in an amount limited to 0.006% to 0.008% by weight, wherein the seal function layer is formed by ion implantation on the surface of the ultra-low carbon stainless steel.

5. The ultra-low carbon stainless steel according to claim 1, wherein the seal function layer is within a range of 200 nm from the surface layer.

6. The ultra-low carbon stainless steel according to claim 1, wherein the seal function layer is within a range of 100 nm from the surface layer.

7. The ultra-low carbon stainless steel according to claim 1, wherein the surface accuracy of the ultra-low carbon stainless steel is 7 to 24 nm in the average roughness and 47 to 141 nm in the peak of the roughest irregularity.

* * * * *